US007039196B1

(12) United States Patent
Becker et al.

(10) Patent No.: US 7,039,196 B1
(45) Date of Patent: May 2, 2006

(54) MOTOR VEHICLE SOUND SYSTEM

(75) Inventors: Michael Becker, Philippsburg (DE); Harald Schoepp, Ettlingen (DE); Jochen Klaus-Wagenbrenner, Oberweier (DE)

(73) Assignee: Harman Becker Automotive Systems, GmbH, Karlsbad (DE)

(*) Notice: Subject to any disclaimer, the term of this patent is extended or adjusted under 35 U.S.C. 154(b) by 0 days.

(21) Appl. No.: 09/540,312

(22) Filed: Mar. 31, 2000

(30) Foreign Application Priority Data

Mar. 31, 1999 (DE) ................................ 199 14 805

(51) Int. Cl.
*H04B 1/00* (2006.01)
*G03F 17/00* (2006.01)

(52) U.S. Cl. .......................................... 381/86; 700/94

(58) Field of Classification Search .................. 381/86, 381/300–307; 700/94

See application file for complete search history.

(56) References Cited

U.S. PATENT DOCUMENTS

| | | | | |
|---|---|---|---|---|
| 5,073,943 | A | 12/1991 | Chapman | 381/86 |
| 5,079,759 | A | 1/1992 | Kajiyama | 370/13 |
| 5,218,643 | A | 6/1993 | Nagashima | 381/86 |
| 5,243,640 | A | 9/1993 | Hadley et al. | 379/59 |
| 5,537,104 | A | 7/1996 | Van Dort et al. | 340/825.52 |
| 5,574,514 | A * | 11/1996 | Tanihira et al. | 348/706 |
| 5,812,800 | A * | 9/1998 | Gulick et al. | 710/306 |
| 5,940,398 | A | 8/1999 | Stiegler et al. | 370/424 |
| 6,114,774 | A * | 9/2000 | Fiegura | 307/9.1 |
| 6,157,725 | A * | 12/2000 | Becker | 381/86 |
| 6,301,241 | B1 * | 10/2001 | Watanabe | 370/346 |
| 6,330,337 | B1 * | 12/2001 | Nicholson et al. | 381/86 |

FOREIGN PATENT DOCUMENTS

| | | |
|---|---|---|
| DE | 196 51 308 | 12/1996 |
| EP | 0 725 522 A2 | 7/1996 |
| EP | 0 883 264 | 12/1998 |

* cited by examiner

*Primary Examiner*—Laura A. Grier
(74) *Attorney, Agent, or Firm*—O'Shea, Getz & Kosakowski, P.C.

(57) ABSTRACT

The invention relates to a sound system for a motor vehicle and to a process for specifying the functional scope of such. The sound system (1) for a motor vehicle comprises a control unit (2), and several input units (3, 3*a*) for operating the system (1), as well as display units (4) and several units (5, 11) to generate the source data in the form of sound or video data. The sound data are amplified in an amplifier unit (6), and are conducted to several loudspeakers (7). The units are linked to one another via a bus (8) with a ring topology. Both source data and control data are transmitted over the bus. The functional scope of the individual input units (3, 3*a*) is specified by means of a priority value of the input units (3, 3*a*). This priority value is stored in the memory (12) of each input unit (3, 3*a*). A control command containing this priority value causes the other units of the system (1) to form a priority-dependent functional scope, which represents a subset of the entire functional scope of this unit, and to transmit this back to the respective input unit (3, 3*a*). The latter then generates its functional scope from the priority-dependent functional scopes that have been conducted to it. This functional scope then comprises all functionalities which can be invoked through this input unit (3, 3*a*). Since the various input units (3, 3*a*) have different priority values, they also have different functional scopes. As a result, collisions in the control of the system are essentially eliminated.

19 Claims, 1 Drawing Sheet

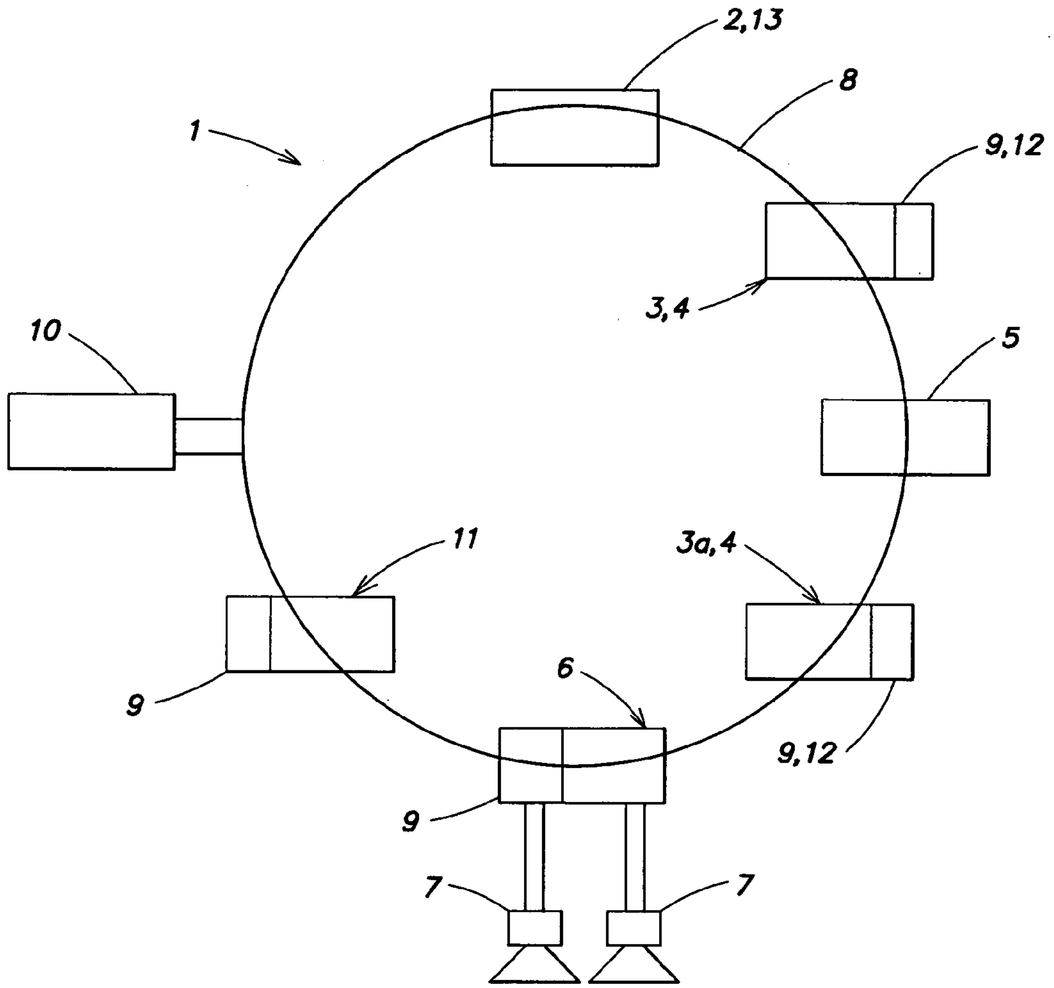
2,13
8
1
9,12
3,4
10
5
11
3a,4
9
6
9,12
9
7
7

MOTOR VEHICLE SOUND SYSTEM

BACKGROUND OF THE INVENTION

The present invention relates to an audio system for a motor vehicle, and in particular to a technique for initializing a sound system for a motor vehicle.

Conventional vehicle sound systems are disclosed in European Patent Application EP-A-0 725522, and in the document entitled "OCC 8001 Conan Optical Transceiver," C&C Electronics Limited, 1996. These sound systems have a control unit (also referred to as a head unit) that control the entire system and makes it possible to: (i) output information through a display unit, (ii) control the system from a single input unit operated by the user, (iii) and convert information into appropriate control instructions for the individual units of the sound system. However, these conventional sound systems have a rigid system structure that only allows units to be integrated into the system that have previously been provided for by appropriate programming of the control unit/head unit. Thus the disclosed sound systems are relatively inflexible, not very user-friendly and expensive, since, in order to adapt the system to support the addition of a new/additional component, the control unit/head unit must be replaced.

An additional limitation of the system disclosed in European Patent Application EP-A-0 725522 is that it has a rigid structure with only a single control unit/head unit, which serves as the sole input possibility for a system that is distributed over the motor vehicle. This single control unit does not allow multiple operation of the sound system, for example by the driver and by the rear passengers.

German application DE 196 51 308 A1 discloses a sound system, the scope of whose functions is formed by the scopes of the functions of the individual components of the sound system. This provides greater flexibility compared to the sound systems described in the preceding paragraph. The functional scope of the individual components, which comprises the possible functionality of these individual components (i.e., all the technical properties of the components which can be addressed by the user) is drawn upon to form the functional scope of the entire system. Within the framework of this system, the user can adjust individual functionalities for his purposes by specifying individual parameters through the single input unit, by means of the control unit. For example, the functionality "bass," as a part of the functional scope of the amplifier component, can be raised to the parameter value +5 dB. This parameter value is adjusted by the control unit of the sound system. However, this sound system is limited to a single input unit.

Therefore, there is a need for a motor vehicle sound system that is flexible (e.g., expandable) and at the same time can be operated as easily, economically and reliably as possible.

SUMMARY OF THE INVENTION

Briefly, according to the present invention, a motor vehicle multimedia sound system that provides audio signals to a speaker includes a plurality of input units that each receive a uniquely associated priority value indicative of the scope of authority each of the input units has been assigned over the motor vehicle sound system. The system also includes a system bus and a plurality of audio generating components each capable of communicating with the plurality of input units over the system bus and being selectively controlled by the plurality of input units.

The sound system includes at least two input units. A first input unit is accessible by the driver and front seat passenger, while a second input unit is preferably easily accessible to a passenger (e.g., in a rear seat of the vehicle). This makes it possible to control individual or several units of the sound system (preferably selected units) with either input unit. The input units can be distributed within the vehicle (e.g., at positions that are associated with the individual seating positions in the motor vehicle). Multiple input units, properly located, allow the sound system to be easily operated from all seats of the vehicle.

To prevent input collisions (i.e., contention) between the various input units, a priority value is assigned to each of the input units in order to resolve any input signal contentions. The priority values are stored in a memory of the respective input unit. The priority value specifies the functional scope the input unit has assigned to it. The priority values provide specification of the functional scopes of the individual input units, which at least largely prevents functional collisions of inputs provided through the various input units. That is, assigning priorities to the various input units eliminates the risk of the sound system crashing due to contention, and facilitates using the sound system in a comprehensive manner.

A memory, which is preferably part of the respective unit, is associated with each audio/video generating component whose functional scope is used to form the functional scope of the individual units. In this memory is stored the maximum allowable functional scope of this unit, such that this functional scope can be divided into different parts depending upon the priority value assigned to the unit. In response to an appropriate control signal for transmitting the relevant functional scope and specifying the relevant priority value of the respective input unit, the unit forms a partial set of its functional scope corresponding to the relevant priority value, and transmits this scope via a bus to the relevant input unit. This input unit receives from the various other media generating units of the sound system their respective functional scopes that correspond to the priority value of the relevant input unit. From these functional scopes of the units, the input unit forms its functional scope, which comprises the functionalities that can be activated by this input unit.

Because each input unit forms its functional scope based upon on a priority value, the input units are ranked for various functionalities of the sound system. For example, the functional scope of the input unit at the rear seat of the vehicle, and thus also the functional scope of the entire system, can be specified so that the audio signal amplifier responsible for the rear seat can be raised or lowered in volume by the functionality "volume". Therefore, loudspeakers connected to the audio signal amplifier are driven with an amplified electrical audio signal whose value is based upon the volume selected in the rear seat. In contrast, the other input unit at the driver's seat, can adapt, for example, the voice output of the navigation unit independently of the input unit located in the rear seat. That is, the input unit at the rear seat cannot change the volume of the voice output of the navigation unit as part of the sound system due to the functional scope specified by the priority value assigned to the input unit in the rear of the vehicle. With respect to the navigation unit, the priority value of the input unit at the driver's seat is higher than the priority value of the input unit located in the rear of vehicle. Accordingly, in this configuration only the input unit at the driver's seat can control the navigation unit.

The inventive design and initialization of the sound system makes it possible to give each input unit its own individual functional scope, which is formed by sometimes different partial sets of the functional scopes of the individual units of the sound system. Hence, each input unit may be assigned a limited scope of authority over the sound system components. Individual functionalities of individual units can also be addressed with equal priority by several input units. However, this may lead to input signal collisions.

Advantageously, specifying the priority-dependent functional scopes in the individual units, various functional organizations of the sound system can be realized through the individual input units. This provides an especially flexible system design that can be matched to particular needs.

Each input unit may include a keyboard. A priority value is entered into the associated input unit through the keyboard and stored in the input unit memory. This sound system design makes it possible to dispense with complicated programming to specify the individual priority values of the input units, and to dispense with an additional unit in the sound system for specifying the priority values. In addition, this system design makes it possible to operate the sound system simply and reliably, especially under varying operating situations (e.g., by different passengers). For example, depending on the passengers, a rear-seat input unit can be assigned a different priority value, which then produces a different functional scope of this input unit. A child passenger should have a narrowly limited functional scope, while an adult passenger is provided with access to a large number of media units (e.g., telephone, fax, etc.) in a broad functional scope. By entering an appropriate priority value to the input unit, the user himself can create an adaptation in a simple and convenient manner.

According to another preferred embodiment, the control unit of the sound system may assign the priority value to a unit. The priority value is then conducted via the bus to the respective input unit, which accepts the priority value and stores it in its priority-value memory. In response to this priority value, an initialization process is started in which the functional scope of this input unit or of all input units is determined and specified anew. The priority value transmitted by the control unit is transferred, via a central input unit or an interface, to an external data input device connected to the bus system. It is also possible to provide the memories of the individual units with data concerning their functional scope, including its priority-dependent linkage to new, changed data for a future formation of the functional scope of the individual input units. It has proven especially advantageous to make the memory with the functional scope of the unit a part of the unit itself. The resulting structure is simpler and less prone to trouble. The risk of interference, especially through electromagnetic influences, is excluded when transmitting the functional scope or the priority-dependent part of the functional scope of the unit from a memory, via a conductor, to the respective unit.

The sound system can be operated especially simply and pleasantly in that the control unit, an input unit, and the display unit are linked with one another in such a way that the operating menus needed to operate the system are displayed by the display unit in accordance with the functional scope of the input unit. The system is operated by the input unit using the displays in the display unit. The control menus can be specific for the individual functionalities of the individual units, corresponding to the associated priority value. The display unit may have an additional voice output. This feature increases the user-friendliness and operating reliability of the overall system, especially in automobile applications. The input unit can also be designed as a voice-controlled input unit with comparable advantages.

A preferred modification of the sound system is to combine the control unit, the input unit, and the display unit into a single interrelated unit. The display unit is preferably divided into individual segments, to which individual keys of the input unit are spatially assigned. The display indicates the operating functions assigned to the associated key, and the function can be invoked by depressing the associated key(s). This multi-function display design makes it possible to construct the sound system with as few interfaces and units as possible which simplifies management of the total system, control of the respective individual units, and the supply of the system with the necessary power. In addition, this embodiment makes the system less prone to trouble (i.e., it enhances operating reliability and simplifies the system).

A preferred embodiment transmits sound data and multimedia data (e.g., video data) to the appropriate units for generating and displaying the multimedia data. The multimedia generating units may include for example a DVD player, a CD player and navigation devices, etc. Units for displaying the multimedia data include flat panel displays such as LCD or TFT displays.

An advantage of the present invention is that it supports additional multimedia devices with their specific multimedia data as they are developed. That is, the sound system of the present invention can react flexibly at any time to new devices, and can adapt the sound system to the changed needs and requirements simply and flexibly, taking into account the priority values. This adaptation comprises not only the handling of new functionalities by new units, but also changed functional scopes depending upon the priority values of the individual input units. This flexibility is all the more important as the number of units for generating sound and/or multimedia data increases.

Besides the possibility of specifying the functional scopes of the input units at fixed given times, it has proven especially advantageous to turn on the entire sound system or also individual units for detection, and through this detected turn-on to form the functional scopes of the individual input units on the basis of the functional scopes of the individual units. The individual functional scopes are here formed priority-dependent from the total functional scopes of the individual units. Through this technique of forming the functional scope of the individual input units it is assured that a functional scope matched to the individual components can always be activated, which adapts itself automatically to changed conditions, especially when adding more units or replacing individual units. This assures a flexible system with a reliable function due to reduced, simplified management. This system is especially distinguished by the feature that it is not fully functional only for a short period of time, especially when it is being turned on, since during this time the functional scope of input units must first be formed and the system cannot be operated or can be operated only in a limited way during this limited time period. However, when the user turns on the system, this is not felt as very troublesome.

Another beneficial modification of the sound system is for the user to be able to output the functional scopes of the individual input units and the functional scopes of the total sound system as well as of the individual and/or of all the units through the display unit. By appropriately operating the controls associated with the display unit, individual component functional scopes or also the entire functional scopes of individual units can be set by either specifying the priority value or by assigning the individual functionalities to a particular priority value in the unit. After the individual priority-dependent functional scopes have been selected, the entire functional scope of the system or respectively of the input units is then formed. Menus and functionalities corresponding to the new respective functional scope are then assigned to the input units and display units. By pressing the keys of the input unit, a user selects the individual functionalities and changes the parameters for this functionality, such that, in conjunction with the control unit, the respective units of the system are activated so they change their respective functionalities in response to the user input.

Especially suitable is a system which is caused, by means of the input unit, to form the functional scopes of their respective input unit or of the input units of the entire system. If the user needs to change the sound system in one functional scope or needs to adapt it to changed properties, he can cause the functional scopes to be formed by operating one or more control elements of the respective input unit. This assures that, only when it is necessary, will formation of the functional scopes be invoked, and thus the system will be hindered in its function for the shortest possible time. This system comprehensively assures reliable and flexible adaptation to the needs and wishes of the user.

Besides application of the inventive sound system in a motor vehicle, application of this system in an RV or in a house or in an apartment is also advantageous, since, here too, comparable problems arise, especially when adding more units to a system whose units are connected through a bus system. Specifically, comparable advantages appear when individual components are distributed over several rooms and input units are disposed in the individual rooms.

In one aspect, the invention relates to a technique for initializing a sound system to specify the functional scope of the sound system or respectively the functional scope of at least one input unit. For this purpose, this input unit sends a particular control signal via the bus to the other units of the system. This control signal indicates the priority value of the input unit, which is stored in its priority-value memory. In response to this control signal, the other units of the system form a priority-dependent subset of the functional scope stored in their memory. This subset can comprise the full functional scope but also every part thereof, down to functional scope zero. This subset is then transmitted via the bus to the input unit that has generated the control signal. Through the ring topology of the sound system, with a single, ring bus conductor, through which the control data and the sound/video data are transmitted mono-directionally, it is possible, by transmitting the control signal and return transmitting the subsets, and thus the priority-dependent functional scopes, to circle the ring completely. The bus can thus be loaded as uniformly as possible. The functional scope of the input unit is formed from the functional scopes that have been formed in the other units. Through this input unit, the other individual units can thus be specifically activated in a priority-dependent manner, in accordance with the functionalities of their functional scope. The priority-differentiated formation of the functional scopes of the various input units assures that collisions of the user's interests or collisions of the user's commands are markedly reduced or even eliminated. Consequently, the sound system is reliably controlled.

The priority value of the input unit is preferably guided in accordance with the position of the input unit in the vehicle or in accordance with the user or in accordance with the user's authorization. Thus it also becomes clear that it is very advantageous to change the priority of the individual input units as needed. In this way, it can be assured that, depending upon whether children or adults are seated in the rear, functionalities can or cannot be accessed through the rear input unit. These functionalities can concern the change of individual parameters of individual units, for example volume, bass, treble, fade, balance, equivalence, etc., or also individual functions such as, for example, play, tracking, repeat, fast forward, rewind, tuning, band change, silencing, traffic messages activated/deactivated, start seek, RDS functions activated/deactivated, etc.

It has proven advantageous to choose the priority values as numerical values or respectively as natural numerical values, which typically are chosen differently for different input units. This essentially excludes collision of functionalities through identical functional scopes of the individual input units with the same priority value. The priority values are preferably entered either by the user, through the input unit itself, for example through a keyboard or through a voice input. Alternatively, the priority value may be written into the memory for the priority value of the respective input unit by a unit for specifying the priority values. This unit may be situated in any unit of the sound system. Input of the priority value by the user makes control of the system very simple, but the user must actively participate in the initialization process and must follow certain rules. However, when the priority values are automatically specified by an appropriate unit of the sound system a higher level of organization and control is required. In this case, it has proven especially advantageous to test the sound system regularly for changes, especially by adding or removing or replacing components or also to test it for whether the functionalities of individual units wish to be changed, for example by changing the priority values of the input units. If such an event is detected, the functional scopes of the input units and thus the functional scope of the system may be specified anew. Independently of this, it is preferred that whenever the system or individual components thereof are turned on, the initialization process is started, since in this way new functionalities can be incorporated into the functional scope of the respective input units.

These and other objects, features and advantages of the present invention will become apparent in light of the following detailed description of preferred embodiments thereof, as illustrated in the accompanying drawings.

BRIEF DESCRIPTION OF THE DRAWINGS

The FIGURE illustrates a distributed multimedia sound system, suitable for use for example in a motor vehicle.

DETAILED DESCRIPTION OF THE INVENTION

The FIGURE illustrates a distributed sound system 1. The system 1 includes a control unit 2 that comprises a unit for specifying priority values 13, at least two input units 3, **3*a* that each includes an associated output unit 4, a memory 12 for storing a priority value, and a memory 9 for storing the functional scope of the input unit 3, 3*a*. This combined apparatus is often referred to as a man-machine interface (MMI). The sound system 1 also comprises a unit for generating source data in the form of sound data (e.g., a CD player 5), as well as a unit for generating multimedia data (e.g., a DVD player). Furthermore, the system 1 includes an amplifier unit 6 with two loudspeakers 7 connected thereto, as well as a CPU 10**.

The various units are connected together through a ring bus system 8. The bus 8 is formed from individual bus segments from a data line, which always joins two neighboring units to one another, and which joins all the units of the system together in a ring. Data is transmitted in one direction on the bus system 8, in a continuous data stream, which enables sound-video data transmission in real-time without buffering. The transmission includes both real-time relevant sound and video data as well as control data.

The CPU 10 can be connected to or disconnected from the bus system 8 via an interface. Thus, it can be linked to the system or removed from it as needed.

The input units 3, 3*a* as well as the amplifier unit 6 and the DVD player 11 have an associated memory 9, in which is stored the functional scope of the respective unit, that is determined as of the priority. The input units 3, 3*a* also have a memory 12 that contains the priority value of the respective input unit 3, 3*a*.

Operation of the sound system 1 is detected by the control unit 2 and initialization of the bus system 8 and the connected units 2, 3, 3*a*, 4, 5, 6, 10, 11 begins. Initialization of the system typically comprises, among other things, synchronization of the individual units as well as logons by authorized users for subsequent allocation of data channels to be used for communication between the individual units. Furthermore, the functional scope of the system 1 is also defined, for which purpose especially the functional scope of the individual input units 3, 3*a* is specified.

To specify the functional scope of the input unit 3, the input unit 3 sends a control command to the other units of the sound system 1 via the bus 8. This control command contains the priority value stored in the memory 12 of the input unit 3. Each unit interprets this control command and returns its functional scope to the input unit 3 via the ring bus system 8. The other units form their functional scope in dependence on the priority value transmitted with the control command from the input unit 3. Once formed, the functional scope may comprise the entire functional scope of the individual unit, or parts thereof, down to zero. The priority value specifies the scope and the individual functionalities that can be addressed by the respective input unit 3, and which form the priority-dependent functional scope of the other units. The functional scopes are collected together by the input units to form the functional scope of the input unit 3. Based upon the functional scope of the input unit 3, the sound system 1 is able to activate the functionalities of the individual units in accordance with the specified functional scope of the input unit 3, and to supply the individual units with the data necessary for their functioning in the system. The functional scope of the second input unit 3*a* is setup in a similar manner. However, the second input unit 3*a* has a different priority value and thus exhibits a different functional scope in comparison to the first input unit 3.

Based upon the functional scope of the MMI, the display unit 4 is divided into individual segments. The individual segments are associated with individual keys of the input unit 3 both spatially and functionally, and in such a way that the segments show a representation of the operating function of the key associated with the segment, typically in the form of a pietogram. Pressing one of the keys invokes the function shown in the associated segment of the display unit 4. These functions can be various in nature, such as for example, increase volume, decrease volume, loudness on or off, surround on or off, switch to TV tuner, or much more. Through this display, the user can operate the entire system 1 easily and comfortably to the extent that has been assigned to him through the priority value of the respective input unit 3. The displays for the functions and the data required for operation are stored in the memory 9 of the input unit 3. The maximum available functional scope for the input unit 3 itself is also stored in the memory.

If one of the units 3, 3*a*, 4, 5, 6, 10, 11 is: (i) removed from the system 1, (ii) replaced by another unit, or (iii) if a further unit is added, it is detected by the control unit 2. A process is then automatically executed to specify the functional scopes (initialization) of the input units 3, 3*a*, and thus the functional scope of the entire sound system 1 is defined. In the manner described above, all functional scopes of the individual units, are sequentially drawn upon within the functional scope of the entire sound system 1 to form the functional scopes of the individual input units 3, 3*a*. This manner of invoking the initialization process ensures that the entire sound system, together with its units is always available in its desired scope of functionality.

It is generally not necessary for the user to actively trigger the initialization process with the process for specifying the functional scopes. The user himself may trigger a new initialization, for example by entering a changed priority value into the input unit 3, 3*a*, which corresponds to changing or replacing a unit. By this change of priority value, the behavior of the sound system 1 can change considerably and thus can be easily adapted to various external circumstances. Significantly, the same system can exhibit completely different behavior and look by a simple change of the priority values.

Data can be exchanged with the other units of the system 1 via a connectable and disconnectable interface and the CPU 10. In particular, the functional scopes of the individual units, including their priority-dependent organization, as these are stored in the memories 9, can be replaced by a new functional scope and/or a changed priority-dependent organization. Thus it is possible, without replacing individual units, to create a basis for changed functional scopes and to delete data in the system 1. This makes the system 1 especially flexible and adaptable in a simple and secure manner. It is now possible to make new functionalities (which may arise only in the future) easily accessible to the system 1.

The control unit 2 also includes a unit for specifying the priority values 13 to the individual input units 3, 3*a*, via the bus system 8. In response to those different, assigned priority values, the functional scopes are automatically adapted without additional action by the user. In this way, it is possible (e.g., with a seat detection unit) that a changed higher-rank or lower-rank priority value is automatically assigned to a single input unit 3, 3*a* by the unit 13 which specifies the priority values based upon whether or not a person is sitting in certain seat. As a result, the functional scope and thus the scope of the functionalities of this input unit 3, 3*a* will change accordingly.

The differentiated assignment of priority values assures that various functional scopes and thus various functionalities are accessible to the individual input units 3, 3*a*, and thus the risk of interest collisions (i.e., access to the same functionality), is reduced or even eliminated, for example in the case of changing the volume or station setting of the radio receiver or a track jump of the DVD player. This provides operating reliability while maintaining the flexibility of the system to a special degree.

Although the present invention has been shown and described with respect, to several preferred embodiments thereof, various changes, omissions and additions to the form and detail thereof, may be made therein, without departing from the spirit and scope of the invention.

What is claimed is:

1. A sound system for a motor vehicle comprising a control unit, a first input unit to operate the system, a display unit, at least one unit to generate source data that includes sound data, an amplifier unit to amplify the source data, at least one loudspeaker, a bus to link the input, display, source data and amplifier units to assure transmission of source data and to control the input, display, source data and amplifier units that are distributed over the vehicle, and at least one system unit, different from the control unit and having an associated memory in which a functional scope of this unit is stored, such that this functional scope can be transmitted over the bus, and the transmitted functional scope can be drawn upon at least partially to form the functional scope of the entire system, where the sound system further comprises a second input unit where the first and second input units have a memory in which is stored a priority value for each of the input units, that the first and second input units conduct their priority value to units connected on the bus, that the units of the system, other than the control unit, together with their associated memories form the transmitted functional scope in dependence on their priority value and conduct the formed and transmitted functional scope, via the bus, to the first and second input units with an appropriate priority value, and that the first or second input unit with this priority value draws upon the transmitted functional scopes, formed in accordance with their priority value, to form its functional scope.

2. The sound system of claim 1, where at least one of the first or second input units comprises a keyboard through which the priority value can be entered.

3. The sound system of claim 1, where the control unit automatically assigns a specific priority value to each of the first and second input units.

4. The sound system of claim 1, where the control unit, one of the first or second input units, and the display unit are linked with one another in such a way that the operating menus needed to operate the system are displayed by the display unit in accordance with the functional scope of one of the first or second input units, and the system is operated via inputs to the first or second input unit, using the displays in the display unit.

5. The sound system of claim 1, where the source data comprises multimedia data.

6. The sound system of claim 5, where turning on the sound system or an individual unit triggers the formation of the functional scopes of the first and second input units from the functional scopes of the individual units.

7. The sound system of claim 5, where the formation of the functional scopes of the input units from the functional scopes of the individual units can be invoked by means of an input unit.

8. A method of specifying functional scope of a first sound system input unit, which cooperates with at least a second sound system input unit to control multimedia data generating units that communicate with the first and second sound system input units over a system bus, the method comprising the steps of:

sending a control signal containing a priority value from the first sound system input unit to the multimedia data generating units over the system bus;

receiving, from each of the multimedia data generating units, functional scope data indicative of the authority the first sound system input unit has over the associated multimedia data generating unit; and configuring a display unit of the first sound system input unit to display control information that is indicative of the functional scope that the first sound system input unit has been assigned, where the steps of sending, receiving and configuring are performed in the event the sound system is turned on, additional multimedia data generating units are added or removed from the unit, or the priority value is changed.

9. The method of claim 8, where a control unit supplies data to the first sound system input unit and to the display unit in correspondence with the functional scope of the first sound system input unit, and the first sound system input unit receives command inputs regarding the functional scope of the input unit including command inputs associated with volume, bass, treble, fade and balance.

10. The method of claim 8, where a control unit supplies control data to the first sound system input unit and to the display unit in correspondence with the functional scope of the first sound system input unit, and the first sound system input unit receives command inputs regarding the functional scope of the input unit including command inputs associated with the functions of play, track jump, repeat, fast forward, rewind, tuning, band change, silencing, activating/deactivating traffic messages, starting the seek function, and activating/deactivating RDS functions.

11. A vehicle sound system that provides an audio signal to a speaker system, comprising:

a first input unit that receives a first priority value indicative of a first scope of authority that the first input unit has been assigned over the vehicle sound system;

a second input unit that receives a second priority value indicative of a second scope of authority the second input unit has been assigned over the vehicle sound system;

a system bus; and a plurality of sound system generating components each capable of communicating with the first and second input units over the system bus and being selectively controlled by the first and second input units via the system bus, where the first input unit comprises an input interface that allows a user to specify the first priority value.

12. The sound system of claim 11, where the first input unit transmits the first priority value onto the system bus and the plurality of sound system generating components respond to the first input unit with their functional scope data that is associated with the first priority value.

13. The sound system of claim 12, where the second input unit transmits the second priority value onto the system bus and the plurality of sound system generating components respond to the second input unit with their functional scope data associated with the second priority value.

14. The sound system of claim 11, where the first unit comprises a memory device that stores the first priority code and stores functional scope data provided by each of the plurality of sound system generating components and associated with the first priority value.

15. A vehicle sound system that provides an audio signal to a speaker system, comprising:

a first input unit that receives a first priority value indicative of a first scope of authority that the first input unit has been assigned over the vehicle sound system, where the first input unit comprises a display that presents information indicative of the scope of functions that may be controlled from the first input unit;

a second input unit that receives a second priority value indicative of a second scope of authority the second input unit has been assigned over the vehicle sound system;

a system bus; and a plurality of sound system generating components each capable of communicating with the first and second input units over the system bus and being selectively controlled by the first and second input units via the system bus.

16. A motor vehicle multimedia sound system that provides audio signals to a speaker, the sound system comprising:

a plurality of input units that each receive a uniquely associated priority value indicative of a scope of authority each of the input units has been assigned over the motor vehicle multimedia sound system;

a system bus; and a plurality of audio generating components each capable of communicating with the plurality of input units over the system bus and being selectively controlled by the plurality of input units, where the plurality of input units comprises a first input unit that is accessible to occupants of a front seat of a motor vehicle, and the first input unit includes an input interface that allows a user to specify a first priority value associated with the first input unit.

17. The sound system of claim 16, where the plurality of input units comprises a first input unit that transmits a first priority value onto the system bus and the plurality of audio generating components respond to the first input unit with their functional scope data that is associated with the first priority value.

18. The sound system of claim 17, where the plurality of input units comprises a second input unit that is accessible to occupants of a rear seat of a motor vehicle, where the second input unit transmits a second priority value onto the system bus and the plurality of audio generating components respond to the second input unit with their functional scope data associated with the second priority value.

19. A motor vehicle multimedia sound system that provides audio signals to a speaker, the sound system comprising:

a plurality of input units that each receive a uniquely associated priority value indicative of a scope of authority each of the input units has been assigned over the motor vehicle multimedia sound system;

a system bus; and a plurality of audio generating components each capable of communicating with the plurality of input units over the system bus and being selectively controlled by the plurality of input units, where the plurality of input units comprises a first input unit including a display that presents information indicative of the scope of functions that may be controlled from the first input unit.

* * * * *